United States Patent
Wang et al.

(10) Patent No.: US 10,514,894 B2
(45) Date of Patent: Dec. 24, 2019

(54) METASTABLE TRUE RANDOM NUMBER GENERATOR REALIZED ON FPGA

(71) Applicant: Ningbo University, Zhejiang (CN)

(72) Inventors: Pengjun Wang, Zhejiang (CN); Hongzhen Fang, Zhejiang (CN); Yuejun Zhang, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 16/045,688

(22) Filed: Jul. 25, 2018

(65) Prior Publication Data

US 2019/0155576 A1    May 23, 2019

(30) Foreign Application Priority Data

Nov. 17, 2017   (CN) ............................ 2017 1 1141886

(51) Int. Cl.
  *G06F 7/58* (2006.01)
  *H03K 3/84* (2006.01)

(52) U.S. Cl.
  CPC ................ *G06F 7/588* (2013.01); *G06F 7/58* (2013.01); *H03K 3/84* (2013.01)

(58) Field of Classification Search
  CPC .................................................. G06F 7/58–588

(Continued)

(56) References Cited

U.S. PATENT DOCUMENTS

| | | | |
|---|---|---|---|
| 2005/0193045 A1* | 9/2005 | Yamamoto | G06F 7/588 708/250 |
| 2014/0250160 A1* | 9/2014 | Ihor | G06F 7/588 708/251 |
| 2018/0129476 A1* | 5/2018 | Wesson | G06F 7/582 |

OTHER PUBLICATIONS

D. Lee, H. Seo and H. Kim, "Metastability-based Feedback Method for Enhancing FPGA-based TRNG," International Journal of Multimedia and Ubiquitous Engineering, vol. 9, No. 3, pp. 235-248, 2014 (Year: 2014).*

(Continued)

*Primary Examiner* — Matthew D Sandifer
(74) *Attorney, Agent, or Firm* — JCIPRNET

(57) ABSTRACT

A metastable true random number generator realized on an FPGA comprises a configurable delay chain including rough adjustment module and a fine adjustment module. The rough adjustment module comprises 32 rough adjustment cells each including a $1^{st}$ 6-input lookup table and a two-to-one selector. The $1^{st}$ input port of each $1^{st}$ 6-input lookup table is connected to the $1^{st}$ input terminal of the corresponding two-to-one selector, and the connecting terminal is the input terminal of the corresponding rough adjustment cell. The $2^{nd}$ input port, the $3^{rd}$ input port, the $4^{th}$ input port, the $5^{th}$ input port and the $6^{th}$ input port of each $1^{st}$ 6-input lookup table are all accessed to a low level 0. The output port of each $1^{st}$ 6-input lookup table is connected to the $2^{nd}$ input terminal of the corresponding two-to-one selector. The metastable true random number generator has the advantages of being capable of well counteracting inherent delay deviations, high in automation degree and high in output rate and having an operating point not prone to deviation.

3 Claims, 6 Drawing Sheets

(58) Field of Classification Search
USPC .................................................. 708/250–256
See application file for complete search history.

(56) References Cited

OTHER PUBLICATIONS

C. Li, Q. Wang, J. Jiang and N. Guan, "A metastability-based true random number generator on FPGA," 2017 IEEE 12th International Conference on ASIC (ASICON), pp. 738-741, Oct. 2017 (Year: 2017).*
Mehrdad Majzoobi et al., "FPGA-based True Random Number Generation using Circuit Metastability with Adaptive Feedback Control", Cryptographic Hardware and Embedded Systems—CHES 2011, Sep. 2011, pp. 17-32.

* cited by examiner

METASTABLE TRUE RANDOM NUMBER GENERATOR REALIZED ON FPGA

CROSS-REFERENCE TO RELATED APPLICATION

This application claims the priority benefit of China application serial no. 201711141886.1, filed on Nov. 17, 2017. The entirety of the above-mentioned patent application is hereby incorporated by reference herein and made a part of this specification.

BACKGROUND OF THE INVENTION

Field of the Invention

The invention relates to a true random number generator, in particular to a metastable true random number generator realized on an FPGA.

Description of Related Art

Random number generators have become indispensable in the modern information security field and are mainly used for generating random keys and defending side-channel attacks. According to the realization mechanism, random number generators are divided into pseudo random number generators and true random number generators. The pseudo random number generators generally generate random number sequences with certain periodicities through a specific algorithm and are simple in realization method and high in generation rate but are low in safety. The true random number generators mainly use physical random sources (such as thermal noise, shot noise and Brownian motions) in nature as entropy sources and can generate high-randomness and high-reliability random number sequences, but are complex in circuit design and generally low in generation rate.

Existing true random number generators are realized mainly through an analogy circuit method or a digital circuit method. As for the analogy circuit method, thermal noise of charged resistors or shot noise of charged diodes is amplified through an analogue amplifier, and the amplified noise is converted into digital square waves with a random duty ratio through a comparator. The analogy circuit method can maximize the randomness of output sequences, but has the problems of complex circuit design, high power consumption and poor robustness. The digital circuit method achieves the randomness of circuits mainly through the metastable phenomenon. As for a bistable circuit such as a D flip-flop, when data are collected, if the setup time or the hold time is not met, namely the time interval Δ between the data transition and the clock transition is shorter than the setup time/hold time, the D flip-flop will enter into a metastable state due to the failure to work out an output result, then randomly outputs 0 or 1 under the influence of circuit noise and quits from the metastable state. Theoretically, the smaller the value of Δ, the easier the D flip-flop enters into the metastable state. If the D flip-flop continuously outputs 1, it indicates that the signal transition of the data terminal of the D flip-flop lags behind the signal transition of the clock terminal and the transition delay of the signal of the data terminal needs to be increased or the transition delay of the signal of the clock terminal needs to be decreased. If the D flip-flop continuously outputs 0, it indicates that the signal transition of the data terminal of the D flip-flop is ahead of the signal transition of the clock terminal and the transition delay of the signal of the data terminal needs to be decreased or the transition delay of the signal of the clock terminal needs to be increased. FIG. 1(a) shows a specific oscillogram of four different transition intervals of the D flip-flop, and FIG. 1(b) shows a probability curve of output 1 of the D flip-flop. In FIG. 1(a), 1, 2, 3 and 4 separately represent four transition moments of the signal of the data terminal of the D flip-flop. In FIG. 1(b), 1, 2, 3 and 4 separately represent the probabilities of output 1 of the D flip-flop at the four transition moments. As can be seen from analysis on FIG. 1(b), in the metastable interval (from the transition moment 2 to the transition moment 3), the probability of 1 tends towards 50%.

Based on the metastable digital characteristic, metastable true random number generators can be well realized on FPGAs and are small in circuit area, and low in cost and power consumption. However, the metastable points of circuits are unstable and extremely likely to deviate, and thus, to stably obtain random numbers, feedback circuits are generally needs to keep the circuits operating at the metastable points. A metastable true random number generator realized on a Xilinx Virtex5 FPGA is disclosed in Bibliography 1 (Majzoobi M, Koushanfar F, Devadas S. *FPGA-based true random number generation using circuit metastability with adaptive feedback control* [C]. *International Workshop on Cryptographic Hardware and Embedded Systems*. Springer Berlin Heidelberg, 2011: 17-32), which successfully solves the problem about metastable operating points. FIG. 2 shows a structural diagram of the metastable true random number generator realized on the Xilinx Virtex5 FPGA.

The metastable true random number generator comprises a $1^{st}$ decoder, a $2^{nd}$ decoder, a binary counter for outputting a 12-bit digital signal, a D flip-flop D1, an analysis and filter module, a delay circuit and a processing module for processing output random sequences. The delay circuit comprises two identical configurable delay chains. One configurable delay chain is connected to the clock terminal of the D flip-flop D1, and the other configurable delay chain is connected to the data input terminal of the D flip-flop. The basic cell of the configurable delay chains is the lookup table which is the basic logic cell of the FPGA and can be called through lookup table primitives in the FPGA of the corresponding type. The Xilinx Virtex5 FPGA provides a 6-input lookup table. FIG. 3 shows the structure of a universal 6-input lookup table. The 6-input lookup table is composed of 64 static memory cells SRAM and 63 two-to-one data selectors. In FIG. 3, the terminal A1 is the $1^{st}$ port of the 6-input lookup table, the terminal A2 is the $2^{nd}$ port of the 6-input lookup table, the terminal A3 is the $3^{rd}$ port of the 6-input lookup table, the terminal A4 is the $4^{th}$ port of the 6-input lookup table, the terminal A5 is the $5^{th}$ port of the 6-input lookup table, and the terminal A6 is the $6^{th}$ port of the 6-input lookup table. The $1^{st}$ port (terminal A1) is used as a signal input terminal, all 0 or 1 preset in the SRAM are selected, and the other ports are used as address control terminals to determine which selected value in the SRAM is to be output. As different addresses correspond to different transmission paths, a certain delay difference can be caused like the length difference between the full line a1 and the dotted line a2 in FIG. 3, and the precision of the delay difference can reach the picoseconds (ps) level. The 6-input lookup table totally has $2^5=32$ different transmission paths. By means of this characteristic of the 6-input lookup table, the configurable delay chain accessed to the clock terminal of the D flip-flop D1 and the configurable delay chain accessed to the data input terminal of the D flip-flop D1 in the metastable true random number generator are identical and each comprise a rough adjustment module and a fine adjustment module. The rough adjustment module comprises 32 rough adjustment cells. The fine adjustment module comprises 2 fine adjustment cells. FIG. 4(a) shows a structural diagram of the rough adjustment cell, and FIG. 4(b) shows a symbol diagram of the rough adjustment cell, wherein the port i is the input port of the rough adjustment cell, and the ports c are configuration ports. FIG. 4(c) shows a structural diagram of the fine adjustment cell, and FIG. 4(d) shows a symbol diagram of the fine adjustment cell, wherein, the port i is the input port of the fine adjustment cell, and the port c is the configuration port. The $1^{st}$ input port of the 6-input lookup table is used as the input port of the rough adjustment cell, and the other 5 ports of the 6-input lookup table are used as address configuration ports. In this way, when a level calibration signal arrives after decoding, the 6-input lookup table can generate a delay difference between the address $[A_6:A_2]=00000$ and the address $[A_6:A_2]=11111$, and the delay difference is about 10 ps. The $1^{st}$ input port of the 6-input lookup table is used as the input port of the fine adjustment cell, the $2^{nd}$ input port of the 6-input lookup table is used as the address configuration port, and the other four ports are connected to a low level, so that a delay difference between the address $[A_6:A_2]=00000$ and the address $[A_6:A_2]=00001$ is generated and is about 0.625 ps is generated. After the structure of the metastable true random number generator is mapped onto the FPGA, the delay difference between the data terminal and the clock terminal of the D flip-flop is shown as Formula (1):

$$\Delta = \Delta_b + \Delta_p - \Delta_f \quad (1)$$

Wherein, $\Delta_b$ is an inherent circuit delay generated during compilation and synthesis, $\Delta_p$ is the delay difference caused by non-ideal factors during operation of the metastable true random number generator, and $\Delta_f$ is the delay difference generated by the two configurable delay chains and has the following expression:

$$\Delta_f = w_{cs}\delta_{cs} + w_{fn}\delta_{fn} \quad (2)$$

$\delta_{cs}$ is the adjustment step length corresponding to each rough adjustment cell, $\delta_{fn}$ is the adjustment step length corresponding to each fine adjustment cell, $w_{cs}$ is the adjustment weight of the rough adjustment module in each configurable delay chain, and $w_{fn}$ is the adjustment weight of the fine adjustment module in each configurable delay chain. As the two configurable delay chains in FIG. 2 are of a longitudinally-symmetrical differential structure, the adjustment weight refers to the difference of the number of 1 in an upper configuration signal and the number of 1 in a lower configuration signal. For instance, as is shown in FIG. 2, the rough adjustment cells can adjust the delay difference (about 10 ps) between the address $[A_6:A_2]=00000$ and the address $[A_6:A_2]=11111$, and the upper delay chain and the lower delay chain are each provided with 32 rough adjustment cells. If the configuration ports of the rough adjustment part of the data terminal are all accessed to 1 and the configuration ports of the rough adjustment part of the data terminal are all accessed to 0, +32 (+320 ps) adjustment weights will be generated by the rough adjustment part of the whole system, otherwise −32(−320 ps) adjustment weights will be generated, and 64 adjustment weight points (integer) are generated totally. The adjustment weights are generated by the binary counter after decoding, and the corresponding decoding formula is as follows:

$$w_{cs/fn} = (-1)^{C_k} \times \left(1 + \sum_{i}^{K-1} C_i \times 2^i\right), K = \log_2 n \quad (3)$$

In formula (3), $C_i$ is the $i^{th}$ bit of the corresponding binary value, and n is the total number of upper rough adjustment/fine adjustment cells in one configurable delay chain. In FIG. 2, the rough adjustment module is configured through higher 6-bit codes of the binary counter, and the fine adjustment module is configured through lower 6-bit codes of the binary counter. When the metastable true random number generator starts to operate, the binary counter will be initialized to a certain value, and thus $\Delta_f$ has an initial value. If the D flip-flop outputs 1, the value of the binary counter is made to plus 1. If the D flip-flop outputs 0, the value of the binary counter is made to minus 1. Therefore, the value of $\Delta_f$ continuously and dynamically changes to adjust $\Delta$. After the D flip-flop enters into the metastable state, the probabilities (50%) of output 0 and output 1 are almost equal, in this case, the value of the binary counter is stabilized near a constant and changes slightly only in low bit, and thus, the metastable true random number generator is fine adjusted only through the fine adjustment module after being stabilized. Output of the D flip-flop and the value of the binary counter are input to the analysis and filter module. As the value of the binary counter still changes slightly, the analysis and filter module is used for reversing the value with the highest frequency of occurrence and outputting the corresponding random sequence, and all other deviation values are removed. The finally output original sequence is output after being corrected by a postprocessing module.

According to the metastable true random number generator based on the FPGA in FIG. 2, the system can be well stabilized at the metastable operating point through the configurable delay chain structure so as to stably output a random sequence. However, as the step length of the rough adjustment module and the fine adjustment module is too fine, inherent delay deviations cannot be well counteracted and have to be counteracted through manual locating and wiring as well as the differential symmetry structure, and consequentially, the automation degree is low, and the operating point is extremely prone to deviating. The analysis and filter module is needed to ensure the minimum deviation, and consequentially, the output rate is decreased.

SUMMARY

The technical issue to be settled by the invention is to provide a metastable true random number generator realized on an FPGA, which can well counteract inherent delay deviations without manual locating and wiring or a differential symmetry structure, is high in automation degree and has an operating point not prone to deviation and a high output rate.

Technical solutions used by the invention to settle aforesaid technical issue are stated as follows: A metastable true random number generator realized on an FPGA comprises a $1^{st}$ decoder, a $2^{nd}$ decoder, a binary counter, a D flip-flop, a delay circuit and a postprocessing module. The binary counter is used for outputting a 12-bit digital signal. The $1^{st}$ decoder and the $2^{nd}$ decoder are each provided with a 6-bit input terminal and a 32-bit output terminal. A higher 6-bit digital signal of the 12-bit digital signal output by the binary counter is accessed to the 6-bit input terminal of the $1^{st}$ decoder. A lower 6-bit digital signal of the 12-bit digital signal output by the binary counter is accessed to the 6-bit input terminal of the $2^{nd}$ decoder. The D flip-flop is provided with an input terminal, a clock terminal and an output terminal. The delay circuit comprises a configurable delay chain. The configurable delay chain comprises a rough adjustment module and a fine adjustment module. The rough adjustment module comprises 32 rough adjustment cells. Each rough adjustment cell is provided with an input terminal, a configuration terminal and an output terminal. The input terminal of the $1^{st}$ rough adjustment cell is the input terminal of the rough adjustment module. The output terminal of the $n^{th}$ rough adjustment cell is connected to the input terminal of the $(n+1)^{th}$ rough adjustment cell, wherein n=1, 2, . . . , 31. The output terminal of the $32^{nd}$ rough adjustment cell is the output terminal of the rough adjustment module. The configuration terminals of the 32 rough adjustment cells form the 32-bit configuration terminal of the rough adjustment module. Each rough adjustment cell comprises a $1^{st}$ 6-input lookup table and a two-to-one selector. Each $1^{st}$ 6-input lookup table is provided with 6 input ports and an output port. Each two-to-one selector is provided with a $1^{st}$ input terminal, a $2^{nd}$ input terminal, a selection terminal and an output terminal. The $1^{st}$ input port of each $1^{st}$ 6-input lookup table is connected to the $1^{st}$ input terminal of the corresponding two-to-one selector, and the connecting terminal is the input terminal of the corresponding rough adjustment cell. The $2^{nd}$ input port, the $3^{rd}$ input port, the $4^{th}$ input port, the $5^{th}$ input port and the $6^{th}$ input port of each $1^{st}$ 6-input lookup table are all accessed to a low level 0. The output port of each $1^{st}$ 6-input lookup table is connected to the $2^{nd}$ input terminal of the corresponding two-to-one selector. The selection terminal of each two-two-one selector is the configuration terminal of the corresponding rough adjustment cell. The output terminal of each two-to-one selector is the output terminal of the corresponding rough adjustment cell. The fine adjustment module is provided with an input terminal, a 32-bit configuration terminal and an output terminal. The input terminal of the rough adjustment module is connected to the clock terminal of the D flip-flop. The 32-bit configuration terminal of the rough adjustment module is connected to the 32-bit output terminal of the $1^{st}$ decoder in a one-to-one corresponding mode. The output terminals of the rough adjustment cells are connected to the input terminal of the fine adjustment module. The output terminal of the fine adjustment module is connected to the input terminal of the D flip-flop. The 32-bit configuration terminal of the fine adjustment module is connected to the 32-bit output terminal of the $2^{nd}$ decoder in a one-to-one corresponding mode. The metastable true random number generator further comprises a sampling analysis module and a monitoring module. The output terminal of the D flip-flop is connected to the input terminal of the postprocessing module and the input terminal of the sampling analysis module. The output terminal of the sampling analysis module is connected to the input terminal of the monitoring module. The output terminal of the monitoring module is connected to the input terminal of the binary counter. The sampling analysis module acquires output data of the output terminal of the D flip-flop in real time, every 200 bits of output data acquired are regarded as a set, and the percent of 1 in this set of output data is calculated; and the calculation result is then sent to the monitoring module, and the monitoring module generates a control signal according to the calculation result and sends the control signal to the binary counter. When the percent of 1 is over 80%, the monitoring module controls the value of the binary counter to plus 3. When the percent of 1 is smaller than 80% and greater than 52%, the monitoring module controls the value of the binary counter to plus 1. When the percent of 1 is smaller than 52% and greater than 48%, the monitoring module keeps the value of the binary counter unchanged. When the percent of 1 is smaller than 48% and greater than 20%, the monitoring module controls the value of the binary counter to minus 1. When the percent of 1 is smaller than 20%, the monitoring control module controls the value of the binary counter to minus 3. Under the control of the monitoring module, the binary counter generates and outputs a corresponding 12-bit digital signal. Under the control of the binary counter, the $1^{st}$ decoder and the $2^{nd}$ decoder generate corresponding decoding signals to configure the rough adjustment module and the fine adjustment module in real time.

The fine adjustment module comprises 32 fine adjustment cells. Each fine adjustment cell is provided with an input terminal, a configuration terminal and an output terminal. The input terminal of the $1^{st}$ fine adjustment cell is the input terminal of the fine adjustment module. The output terminal of the $n^{th}$ fine adjustment cell is connected to the input terminal of the $(n+1)^{th}$ fine adjustment cell, wherein n=1, 2, 3, . . . 31. The output terminal of the $32^{nd}$ fine adjustment cell is the output terminal of the fine adjustment module. The configuration terminals of the 32 fine adjustment cells form the 32-bit configuration terminal of the fine adjustment module.

Each fine adjustment cell comprises a $2^{nd}$ 6-input lookup table. Each $2^{nd}$ 6-input lookup table is provided with 6 input ports and an output ports. The $1^{st}$ input port of each $2^{nd}$ 6-input lookup table is the input terminal of the corresponding fine adjustment cell. The $2^{nd}$ input port, the $3^{rd}$ input port, the $4^{th}$ input port, the $5^{th}$ input port and the $6^{th}$ input port of each $2^{nd}$ 6-input lookup table are connected, and the connecting terminal is the configuration terminal of the corresponding fine adjustment cell. The output port of each $2^{nd}$ 6-input lookup table is the output terminal of the corresponding fine adjustment cell. The structure is the same as the structure of the rough adjustment cell of the true random number generator in the prior art. When the whole system of the invention is mapped onto an FPGA, locating and wiring for counteracting inherent delay deviations are not adopted; however, as the adjustment step length of an existing fine adjustment cell is too fine, when the existing fine adjustment cell is applied to the invention, the existing fine adjustment cell cannot be matched with the rough adjustment cells of the invention to enable the D flip-flop to enter the metastable state, or more levels are needed to achieve adjustment. The fine adjustment cells of the invention can achieve adjustment without too many levels and can be well matched with the rough adjustment cells of the invention to enable the D flip-flop to enter the metastable state, and the circuit cost is reduced.

Compared with the prior art, the invention has the following advantages: The rough adjustment module is formed by the 32 rough adjustment cells, each rough adjustment cell is provided with the input terminal, the configuration terminal and the output terminal and comprises the $1^{st}$ 6-input lookup table and the two-to-one selector, each $1^{st}$ 6-input lookup table is provided with the 6 input ports and the output port, and each two-to-one selector is provided with the $1^{st}$ input terminal, the $2^{nd}$ input terminal, the selection terminal and the output terminal; the $1^{st}$ input port of each $1^{st}$ 6-input lookup table is connected to the $1^{st}$ input terminal of the corresponding two-to-one selector, and the connecting terminal is the input terminal of the corresponding rough adjustment cell, the $2^{nd}$ input port, the $3^{rd}$ input port, the $4^{th}$ input port, the $5^{th}$ input port and the $6^{th}$ input port of each $1^{st}$ 6-input lookup table are all accessed to the low level 0; the output port of each $1^{st}$ 6-input lookup table is connected to the $2^{nd}$ input terminal of the corresponding two-to-one selector, and the selection terminal of each two-to-one selector is the configuration terminal of the corresponding rough adjustment cell; and the output terminal of each two-to-one selector is the output terminal of the corresponding rough adjustment cell; as the adjustment step length of the rough adjustment cells is great, a delay circuit structure, comprising two configurable delay chains, of the existing metastable true random number generator of a differential symmetry structure can be abandoned, and all what is required is to connect a delay circuit structure with one configurable chain to the input terminal of the D flip-flop. The number of levels of the rough adjustment cells of the rough adjustment module in the configurable chain of the invention is marked as M, the minimum clock cycle T of the Altera Stratix IV FPGA is 10 ns, the delay is 250 ps, and thus, as long as the relation 250 ps*M>T is ensured on the Altera Stratix IV FPGA, the absolute value of the adjustable delay of the rough adjustment module of the configurable chain is greater than the minimum clock cycle T under the condition that M=32. In this way, under any circumference, the signal transition interval difference A between the input terminal and the clock terminal of the D flip-flop can be adjusted to close to 0 in one clock cycle, inherent delay deviations can be well counteracted to make the D flip-flop enter into the metastable state without manual locating and wiring or a differential symmetry structure, the operating point is unlikely to deviate, and the automation degree is greatly improved; and the analysis and filter module for ensuring the minimum deviation is not needed, and thus, the output rate is increased and can be 10 times that of existing true random number generators.

DESCRIPTION OF THE EMBODIMENTS

The invention is further described as follows in combination with drawings and embodiments.

First Embodiment

Figure 1A:
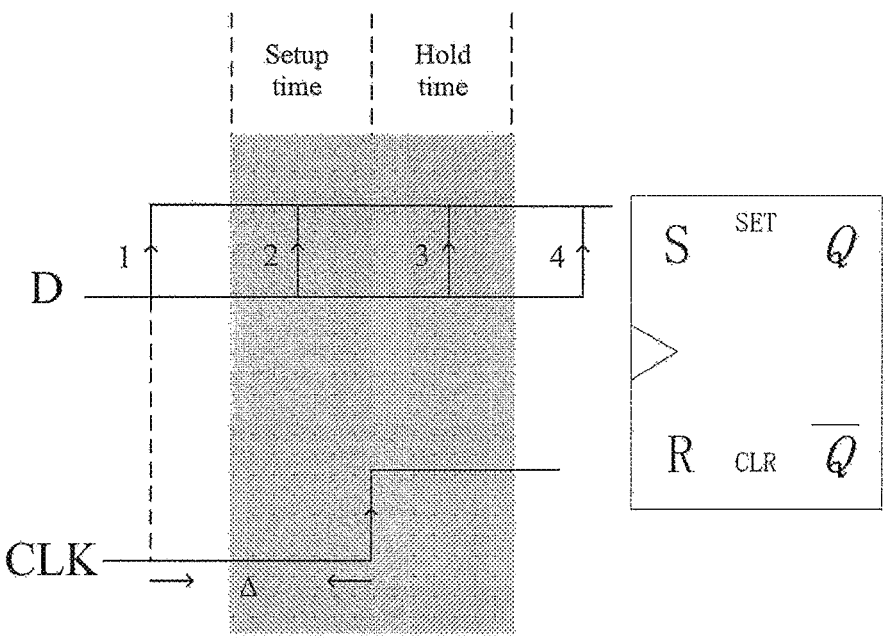
FIG. 1 (a) is a specific oscillogram of four different transition intervals of a D flip-flop.
FIG. 1(b) is a probability curve chart of output 1 of the D flip-flop.
Figure 1B:
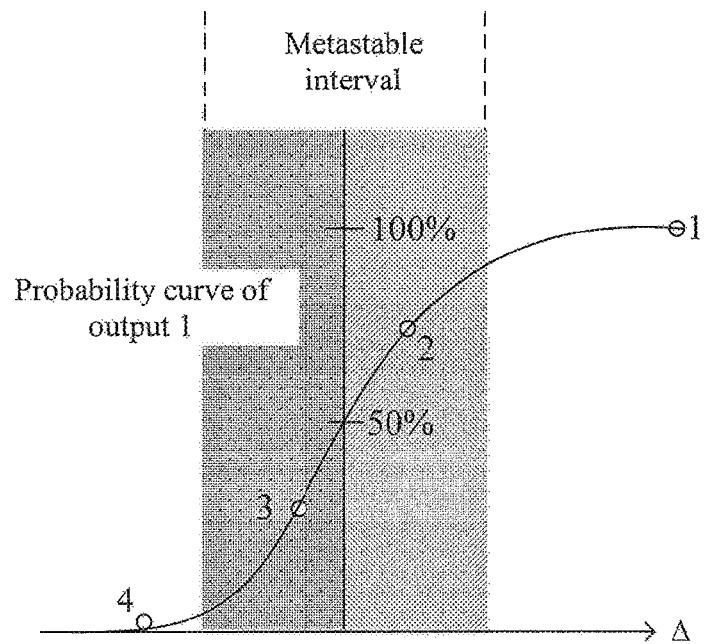
Figure 2:
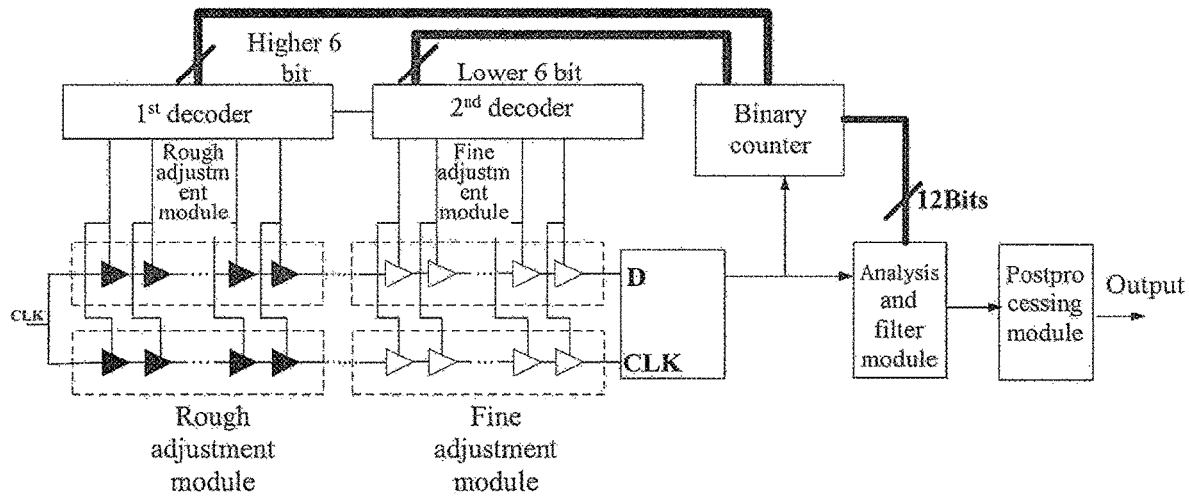
FIG. 2 is a structural diagram of an existing metastable true random number generator.
Figure 3:
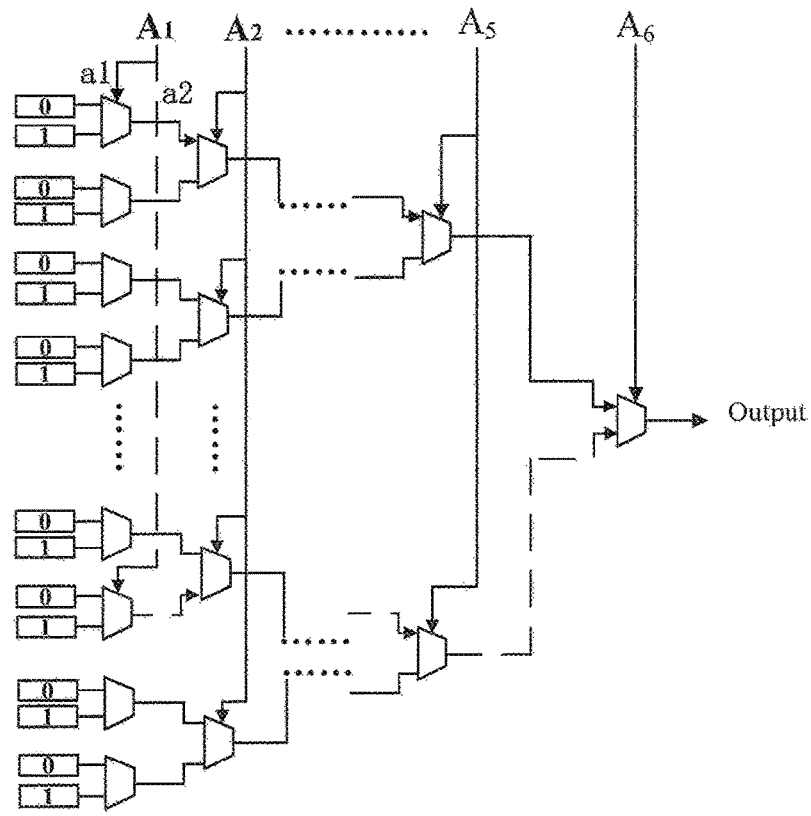
FIG. 3 is a structural diagram of an existing universal 6-input lookup stable.
Figure 4A:
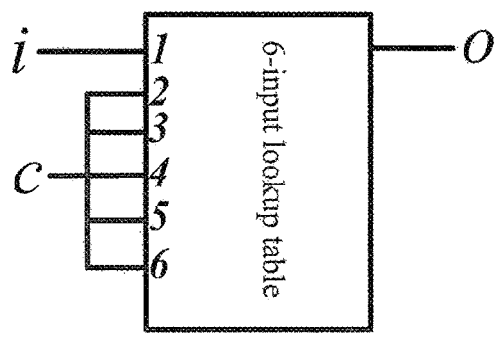
FIG. 4(a) is a structural diagram of an existing rough adjustment cell.
Figure 4B:
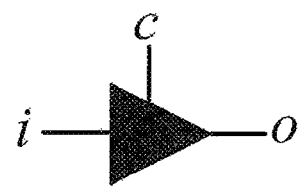
FIG. 4(b) is a symbol diagram of the existing rough adjustment cell.
Figure 4C:
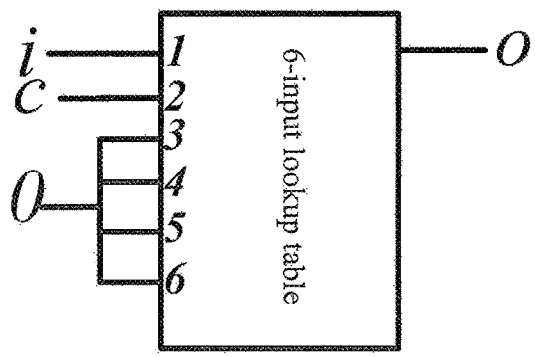
FIG. 4(c) is a structural diagram of an existing fine adjustment cell.
Figure 4D:
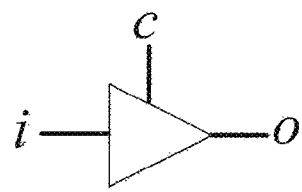
FIG. 4(d) is a symbol diagram of the existing fine adjustment cell.
Figure 5:
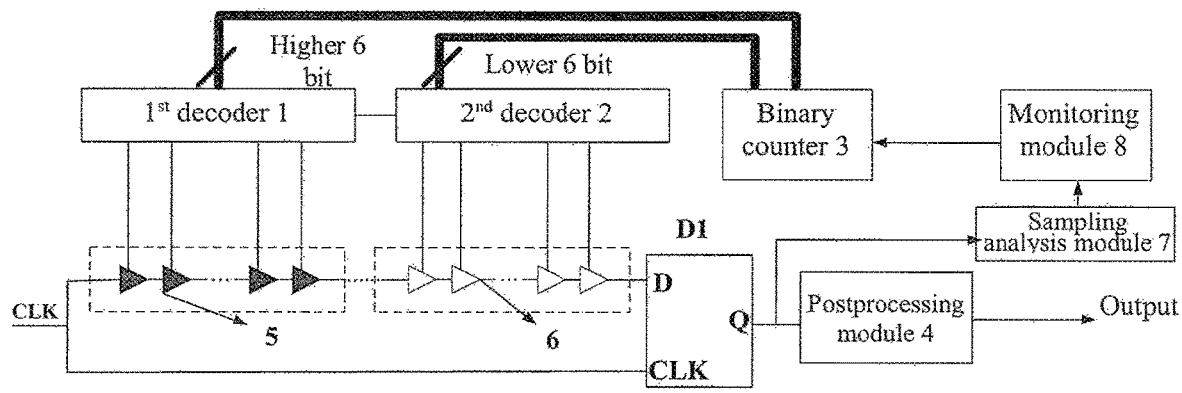
FIG. 5 is a structural diagram of the metastable true random number generator of the invention.
Figure 6A:
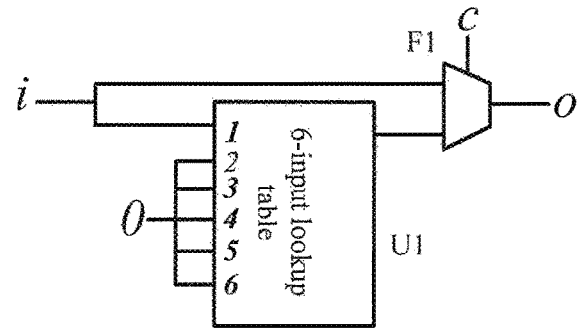
FIG. 6(a) is a structural diagram of the rough adjustment cell of the metastable true random number generator of the invention.
Figure 6B:
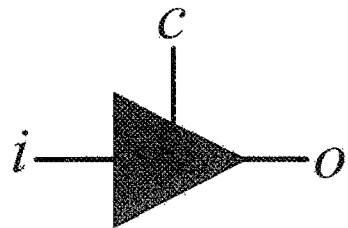
FIG. 6(b) is a symbol diagram of the rough adjustment cell of the metastable true random number generator of the invention.

As is shown in FIG. 5, FIG. 6(a) and FIG. 6(b), a metastable true random number generator realized on an FPGA comprises a $1^{st}$ decoder 1, a $2^{nd}$ decoder 2, a binary counter 3, a D flip-flop D1, a delay circuit and a postprocessing module 4. The binary counter 3 is used for outputting a 12-bit digital signal. The 1st decoder 1 and the $2^{nd}$ decoder 2 are each provided with a 6-bit input terminal and a 32-bit output terminal. A higher 6-bit digital signal of the 12-bit digital signal output by the binary counter 3 is accessed to the 6-bit input terminal of the $1^{st}$ decoder 1. A lower 6-bit digital signal of the 12-bit digital signal output by the binary counter 3 is accessed to the 6-bit input terminal of the $2^{nd}$ decoder 2. The D flip-flop D1 is provided with an input terminal, a clock terminal and an output terminal. The delay circuit comprises a configurable delay chain. The configurable delay chain comprises a rough adjustment module 5 and a fine adjustment module 6. The rough adjustment module 5 comprises 32 rough adjustment cells. Each rough adjustment cell is provided with an input terminal, a configuration terminal and an output terminal. The input terminal of the $1^{st}$ rough adjustment cell is the input terminal of the rough adjustment module 5. The output terminal of the $n^{th}$ rough adjustment cell is connected to the input terminal of the $(n+1)^{th}$ rough adjustment cell, wherein n=1, 2, . . . , 31. The output terminal of the $32^{nd}$ rough adjustment cell is the output terminal of the rough adjustment module 5. The configuration terminals of the 32 rough adjustment cells form the 32-bit configuration terminal of the rough adjustment module 5. Each rough adjustment cell comprises a $1^{st}$ 6-input lookup table C1 and a two-to-one selector F1. Each $1^{st}$ 6-input lookup table C1 is provided with 6 input ports and an output port. Each two-to-one selector F1 is provided with a $1^{st}$ input terminal, a $2^{nd}$ input terminal, a selection terminal and an output terminal. The $1^{st}$ input port of each $1^{st}$ 6-input lookup table C1 is connected to the $1^{st}$ input terminal of the corresponding two-to-one selector F1, and the connecting terminal is the input terminal of the corresponding rough adjustment cell. The $2^{nd}$ input port, the $3^{rd}$ input port, the $4^{th}$ input port, the $5^{th}$ input port and the $6^{th}$ input port of each $1^{st}$ 6-input lookup table C1 are all accessed to a low level 0. The output port of each $1^{st}$ 6-input lookup table C1 is connected to the $2^{nd}$ input terminal of the corresponding two-to-one selector F1. The selection terminal of each two-to-one selector F1 is the configuration terminal of the corresponding rough adjustment cell. The output terminal of each two-to-one selector F is the output terminal of the corresponding rough adjustment cell. The fine adjustment module 6 is provided with an input terminal, a 32-bit configuration terminal and an output terminal. The input terminal of the rough adjustment module 5 is connected to the clock terminal of the D flip-flop D1. The 32-bit configuration terminal of the rough adjustment module 5 is connected to the 32-bit output terminal of the $1^{st}$ decoder 1 in a one-to-one corresponding mode. The output terminals of the rough adjustment cells are connected to the input terminal of the fine adjustment module 6. The output terminal of the fine adjustment module 6 is connected to the input terminal of the D flip-flop D1. The 32-bit configuration terminal of the fine adjustment module 6 is connected to the 32-bit output terminal of the second decoder 2 in a one-to-one corresponding mode. The metastable true random number generator further comprises a sampling analysis module 7 and a monitoring module 8. The output terminal of the D flip-flop D1 is connected to the input terminal of the post-processing module 4 and the input terminal of the sampling analysis module 7. The output terminal of the sampling analysis module 7 is connected to the input terminal of the monitoring module 8. The output terminal of the monitoring module 8 is connected to the input terminal of the binary counter 3. The sampling analysis module 7 acquires output data of the output terminal of the D flip-flop D1 in real time, every 200 bits of output data acquired are regarded as a set, and the percent of 1 in this set of output data is calculated; and the calculation result is then sent to the monitoring module 8, and the monitoring module 8 generates a control signal according to the calculation result and sends the control signal to the binary counter 3. When the percent of 1 is over 80%, the monitoring module 8 controls the value of the binary counter 3 to plus 3. When the percent of 1 is smaller than 80% and greater than 52%, the monitoring module 8 controls the value of the binary counter 3 to plus 1. When the percent of 1 is smaller than 52% and greater than 48%, the monitoring module 8 keeps the value of the binary counter 3 unchanged. When the percent of 1 is smaller than 48% and greater than 20%, the monitoring module 8 controls the value of the binary counter 3 to minus 1. When the percent of 1 is smaller than 20%, the monitoring control module 8 controls the value of the binary counter 3 to minus 3. Under the control of the monitoring module 8, the binary counter 3 generates and outputs a corresponding 12-bit digital signal. Under the control of the binary counter 3, the $1^{st}$ decoder 1 and the $2^{nd}$ decoder 2 generate corresponding decoding signals to configure the rough adjustment module 5 and the fine adjustment module 6 in real time.

Second Embodiment

As is shown in FIG. 5, FIG. 6(a) and FIG. 6(b), a metastable true random number generator realized on an FPGA comprises a $1^{st}$ decoder 1, a $2^{nd}$ decoder 2, a binary counter 3, a D flip-flop D1, a delay circuit and a postprocessing module 4. The binary counter 3 is used for outputting a 12-bit digital signal. The $1^{st}$ decoder 1 and the $2^{nd}$ decoder 2 are each provided with a 6-bit input terminal and a 32-bit output terminal. A higher 6-bit digital signal of the 12-bit digital signal output by the binary counter 3 is accessed to the 6-bit input terminal of the $1^{st}$ decoder 1. A lower 6-bit digital signal of the 12-bit digital signal output by the binary counter 3 is accessed to the 6-bit input terminal of the $2^{nd}$ decoder 2. The D flip-flop D1 is provided with an input terminal, a clock terminal and an output terminal. The delay circuit comprises a configurable delay chain. The configurable delay chain comprises a rough adjustment module 5 and a fine adjustment module 6. The rough adjustment module 5 comprises 32 rough adjustment cells. Each rough adjustment cell is provided with an input terminal, a configuration terminal and an output terminal. The input terminal of the $1^{st}$ rough adjustment cell is the input terminal of the rough adjustment module 5. The output terminal of the $n^{th}$ rough adjustment cell is connected to the input terminal of the $(n+1)^{th}$ rough adjustment cell, wherein n=1, 2, . . . , 31. The output terminal of the $32^{nd}$ rough adjustment cell is the output terminal of the rough adjustment module 5. The configuration terminals of the 32 rough adjustment cells form the 32-bit configuration terminal of the rough adjustment module 5. Each rough adjustment cell comprises a $1^{st}$ 6-input lookup table C1 and a two-to-one selector F1. Each $1^{st}$ 6-input lookup table C1 is provided with 6 input ports and an output port. Each two-to-one selector F1 is provided with a $1^{st}$ input terminal, a $2^{nd}$ input terminal, a selection terminal and an output terminal. The $1^{st}$ input port of each $1^{st}$ 6-input lookup table is connected to the $1^{st}$ input terminal of the corresponding two-to-one selector F1, and the connecting terminal is the input terminal of the corresponding rough adjustment cell. The $2^{nd}$ input port, the $3^{rd}$ input port, the $4^{th}$ input port, the $5^{th}$ input port and the $6^{th}$ input port of each $1^{st}$ 6-input lookup table are all accessed to a low level 0. The output port of each $1^{st}$ 6-input lookup table C1 is connected to the $2^{nd}$ input terminal of the corresponding two-to-one selector F1. The selection terminal of each two-to-one selector F1 is the configuration terminal of the corresponding rough adjustment cell. The output terminal of each two-to-one selector F1 is the output terminal of the corresponding rough adjustment cell. The fine adjustment module 6 is provided with an input terminal, a 32-bit configuration terminal and an output terminal. The input terminal of the rough adjustment module 5 is connected to the clock terminal of the D flip-flop D1. The 32-bit configuration terminal of the rough adjustment module 5 is connected to the 32-bit output terminal of the $1^{st}$ decoder 1 in a one-to-one corresponding mode. The output terminals of the rough adjustment cells are connected to the input terminal of the fine adjustment module 6. The output terminal of the fine adjustment module 6 is connected to the input terminal of the D flip-flop D1. The 32-bit configuration terminal of the fine adjustment module 6 is connected to the 32-bit output terminal of the $2^{nd}$ decoder 2 in a one-to-one corresponding mode. The metastable true random number generator further comprises a sampling analysis module 7 and a monitoring module 8. The output terminal of the D flip-flop D1 is connected to the input terminal of the post-processing module 4 and the input terminal of the sampling analysis module 7. The output terminal of the sampling analysis module 7 is connected to the input terminal of the monitoring module 8. The output terminal of the monitoring module 8 is connected to the input terminal of the binary counter 3. The sampling analysis module 7 acquires output data of the output terminal of the D flip-flop D1 in real time, every 200 bits of output data acquired are regarded as a set, and the percent of 1 in this set of output data is calculated; and the calculation result is then sent to the monitoring module 8, and the monitoring module 8 generates a control signal according to the calculation result and sends the control signal to the binary counter 3. When the percent of 1 is over 80%, the monitoring module 8 controls the value of the binary counter 3 to plus 3. When the percent of 1 is smaller than 80% and greater than 52%, the monitoring module 8 controls the value of the binary counter 3 to plus 1. When the percent of 1 is smaller than 52% and greater than 48%, the monitoring module 8 keeps the value of the binary counter 3 unchanged. When the percent of 1 is smaller than 48% and greater than 20%, the monitoring module 8 controls the value of the binary counter 3 to minus 1. When the percent of 1 is smaller than 20%, the monitoring control module 8 controls the value of the binary counter 3 to minus 3. Under the control of the monitoring module 8, the binary counter 3 generates and outputs a corresponding 12-bit digital signal. Under the control of the binary counter 3, the $1^{st}$ decoder 1 and the $2^{nd}$ decoder 2 generate corresponding decoding signals to configure the rough adjustment module 5 and the fine adjustment module 6 in real time.

Figure 6C:
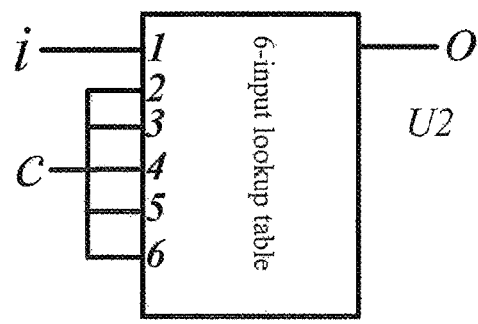
FIG. 6(c) is a structural diagram of the fine adjustment cell of the metastable true random number generator of the invention.
Figure 6D:
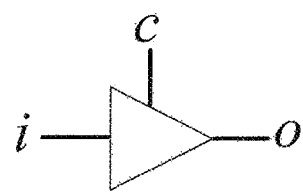
FIG. 6(d) is a symbol diagram of the fine adjustment cell of the metastable true random number generator of the invention.

As is shown in FIG. 6(c) and the FIG. 6(d), in this embodiment, the fine adjustment module 6 comprises 32 fine adjustment cells. Each fine adjustment cell is provided with an input terminal, a configuration terminal and an output terminal. The input terminal of the $1^{st}$ fine adjustment cell is the input terminal of the fine adjustment module 6. The output terminal of the $n^{th}$ fine adjustment cell is connected to the input terminal of the $(n+1)^{th}$ fine adjustment cell, wherein n=1, 2, 3, . . . 31. The output terminal of the $32^{nd}$ fine adjustment cell is the output terminal of the fine adjustment module 6. The configuration terminals of the 32 fine adjustment cells form the 32-bit configuration terminal of the fine adjustment module 6.

In this embodiment, each fine adjustment cell comprises a $2^{nd}$ 6-input lookup table U2. Each $2^{nd}$ 6-input lookup table U2 is provided with 6 input ports and an output port. The $1^{st}$ input port of each $2^{nd}$ 6-input lookup table U2 is the input terminal of the corresponding fine adjustment cell. The $2^{nd}$ input port, the $3^{rd}$ input port, the $4^{th}$ input port, the $5^{th}$ input port and the $6^{th}$ input port of each $2^{nd}$ 6-input lookup table U2 are connected, and the connecting terminal is the configuration terminal of the corresponding fine adjustment cell. The output terminal of each $2^{nd}$ 6-input lookup table U2 is the output terminal of the corresponding fine adjustment cell.

What is claimed is:

1. A metastable true random number generator realized on an FPGA, characterized in that comprises:
   a $1^{st}$ decoder;
   a $2^{nd}$ decoder;
   a binary counter;
   a D flip-flop;
   a delay circuit; and
   a postprocessing circuit,
   wherein the binary counter is used for outputting a 12-bit digital signal,
   wherein the $1^{st}$ decoder and the $2^{nd}$ decoder are each provided with a 6-bit input terminal and a 32-bit output terminal,
   wherein a higher 6-bit digital signal of the 12-bit digital signal output by the binary counter is connected to the 6-bit input terminal of the $1^{st}$ decoder, and a lower 6-bit digital signal of the 12-bit digital signal output by the binary counter is connected to the 6-bit input terminal of the $2^{nd}$ decoder,
   wherein the D flip-flop is provided with an input terminal, a clock terminal and an output terminal,
   wherein the delay circuit comprises a configurable delay chain,
   wherein the configurable delay chain comprises a rough adjustment circuit and a fine adjustment circuit,
   wherein the rough adjustment circuit comprises 32 rough adjustment cells, each rough adjustment cell is provided with an input terminal, a configuration terminal and an output terminal,
   wherein the input terminal of the $1^{st}$ rough adjustment cell is the input terminal of the rough adjustment circuit,
   wherein the output terminal of the $n^{th}$ rough adjustment cell is connected to the input terminal of the $(n+1)^{th}$ rough adjustment cell, wherein n=1, 2, . . . , 31, and the output terminal of the $32^{nd}$ rough adjustment cell is the output terminal of the rough adjustment circuit,
   wherein the configuration terminals of the 32 rough adjustment cells form the 32-bit configuration terminal of the rough adjustment circuit,
   wherein each rough adjustment cell comprises a $1^{st}$ 6-input lookup table and a two-to-one selector,
   wherein each $1^{st}$ 6-input lookup table is provided with 6 input ports and an output port, wherein each two-to-one selector is provided with a $1^{st}$ input terminal, a $2^{nd}$ input terminal, a selection terminal and an output terminal,
   wherein the $1^{st}$ input port of each $1^{st}$ 6-input lookup table is connected to the Pt input terminal of the corresponding two-to-one selector and to the input terminal of the corresponding rough adjustment cell, wherein the $2^{nd}$ input port, the $3^{rd}$ input port, the $4^{th}$ input port, the $5^{th}$ input port and the $6^{th}$ input port of each $1^{st}$ 6-input lookup table are all connected to a low level 0,
   wherein the output port of each $1^{st}$ 6-input lookup table is connected to the $2^{nd}$ input terminal of the corresponding two-to-one selector,
   wherein the selection terminal of each two-two-one selector is the configuration terminal of the corresponding rough adjustment cell, and the output terminal of each two-to-one selector is the output terminal of the corresponding rough adjustment cell,
   wherein the fine adjustment circuit is provided with an input terminal, a 32-bit configuration terminal and an output terminal,
   wherein the input terminal of the rough adjustment circuit is connected to the clock terminal of the D flip-flop,
   wherein the 32-bit configuration terminal of the rough adjustment circuit is connected to the 32-bit output terminal of the $1^{st}$ decoder in a one-to-one corresponding mode, and the output terminals of the rough adjustment cells are connected to the input terminal of the fine adjustment circuit, wherein the output terminal of the fine adjustment circuit is connected to the input terminal of the D flip-flop,
   wherein the 32-bit configuration terminal of the fine adjustment circuit is connected to the 32-bit output terminal of the $2^{nd}$ decoder in a one-to-one corresponding mode,
   wherein the metastable true random number generator further comprises a sampling analysis circuit and a monitoring circuit,
   wherein the output terminal of the D flip-flop is connected to an input terminal of the postprocessing circuit and an input terminal of the sampling analysis circuit, wherein an output terminal of the sampling analysis circuit is connected to an input terminal of the monitoring circuit, wherein an output terminal of the monitoring circuit is connected to an input terminal of the binary counter,
   wherein the sampling analysis circuit acquires output data of the output terminal of the D flip-flop in real time, every 200 bits of output data acquired are regarded as a set, and the percent of bits equal to 1 in this set of output data is generated as a calculation result; and the calculation result is then sent to the monitoring circuit, and the monitoring circuit generates a control signal according to the calculation result and sends the control signal to the binary counter,
   when the percent of bits equal to 1 is over 80%, the monitoring circuit controls the value of the binary counter to plus 3,
   when the percent of bits equal to 1 is smaller than 80% and greater than 52%, the monitoring circuit controls the value of the binary counter to plus 1, when the percent of bits equal to 1 is smaller than 52% and greater than 48%, the monitoring circuit keeps the value of the binary counter unchanged, when the percent of bits equal to 1 is smaller than 48% and greater than 20%, the monitoring circuit controls the value of the binary counter to minus 1, when the percent of bits equal to 1 is smaller than 20%, the monitoring control module controls the value of the binary counter to minus 3, wherein under the control of the monitoring circuit, the binary counter generates and outputs a corresponding 12-bit digital signal, wherein under the control of the binary counter, the $1^{st}$ decoder and the $2^{nd}$ decoder generate corresponding decoding signals to configure the rough adjustment circuit and the fine adjustment circuit in real time.

2. The metastable true random number generator realized on the FPGA according to claim 1, characterized in that the fine adjustment circuit comprises 32 fine adjustment cells, wherein each fine adjustment cell is provided with an input terminal, a configuration terminal and an output terminal, wherein the input terminal of the $1^{st}$ fine adjustment cell is the input terminal of the fine adjustment circuit, wherein the output terminal of the $n^{th}$ fine adjustment cell is connected to the input terminal of the $(n+1)^{th}$ fine adjustment cell, wherein n=1, 2, 3, . . . 31, and the output terminal of the $32^{nd}$ fine adjustment cell is the output terminal of the fine adjustment circuit, wherein the configuration terminals of the 32 fine adjustment cells form the 32-bit configuration terminal of the fine adjustment circuit.

3. The metastable true random number generator realized on the FPGA according to claim 2, characterized in that each fine adjustment cell comprises a $2^{nd}$ 6-input lookup table, and each $2^{nd}$ 6-input lookup table is provided with 6 input ports and an output port, wherein the $1^{st}$ input port of each $2^{nd}$ 6-input lookup table is the input terminal of the corresponding fine adjustment cell, and the $2^{nd}$ input port, the $3^{rd}$ input port, the $4^{th}$ input port, the $5^{th}$ input port and the $6^{th}$ input port of each $2^{nd}$ 6-input lookup table are connected to a connecting terminal, and the connecting terminal is the configuration terminal of the corresponding fine adjustment cell, wherein the output port of each $2^{nd}$ 6-input lookup table is the output terminal of the corresponding fine adjustment cell.

* * * * *